United States Patent
Kiyama et al.

(10) Patent No.: US 8,852,966 B2
(45) Date of Patent: Oct. 7, 2014

(54) HEAT TREATMENT METHOD AND HEAT TREATMENT APPARATUS OF THIN FILM

(75) Inventors: Hiroki Kiyama, Kyoto (JP); Kazuhiko Fuse, Kyoto (JP); Shinichi Kato, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/609,947

(22) Filed: Sep. 11, 2012

(65) Prior Publication Data
US 2013/0078744 A1    Mar. 28, 2013

(30) Foreign Application Priority Data

Sep. 26, 2011 (JP) ................................. 2011-209365
Jul. 9, 2012 (JP) ................................. 2012-153169

(51) Int. Cl.
H01L 21/26 (2006.01)
H01L 21/02 (2006.01)
H01L 21/268 (2006.01)
H01L 21/67 (2006.01)

(52) U.S. Cl.
CPC ...... *H01L 21/2686* (2013.01); *H01L 21/02356* (2013.01); *H01L 21/02337* (2013.01); *H01L 21/0228* (2013.01); *H01L 21/02181* (2013.01); *H01L 21/67109* (2013.01); *H01L 21/67115* (2013.01)
USPC ....... 438/14; 438/769; 438/795; 257/E21.211

(58) Field of Classification Search
USPC ............................................ 438/14, 769, 795
See application file for complete search history.

(56) References Cited

U.S. PATENT DOCUMENTS

| | | | |
|---|---|---|---|
| 2006/0291835 A1* | 12/2006 | Nozaki et al. | 392/416 |
| 2008/0119033 A1* | 5/2008 | Ashigaki et al. | 438/591 |
| 2009/0008695 A1* | 1/2009 | Chen et al. | 257/315 |
| 2009/0067823 A1 | 3/2009 | Kusuda | 392/418 |
| 2009/0285568 A1 | 11/2009 | Kiyama et al. | |
| 2012/0091110 A1 | 4/2012 | Kaneyama | 219/201 |

FOREIGN PATENT DOCUMENTS

| | | |
|---|---|---|
| JP | 2001-332484 | 11/2001 |
| JP | 2007-005532 | 1/2007 |
| JP | 2009-277759 | 11/2009 |
| JP | 2012-084757 | 4/2012 |
| KR | 10-2008-0045652 | 5/2008 |

OTHER PUBLICATIONS

Office Action issued by Korean Patent Office on Oct. 11, 2013 in connection with corresponding Korean Patent Application No. 10-2012-0101656 with Japanese and English Translation thereof.

* cited by examiner

*Primary Examiner* — Alexander Ghyka
(74) *Attorney, Agent, or Firm* — Ostrolenk Faber LLP

(57) ABSTRACT

A semiconductor wafer, on the surface of which a silicon dioxide base material and an amorphous silicon thin film are formed in this order, is carried into a chamber. An insulated gate bipolar transistor (IGBT) is connected with a power supply circuit to a flash lamp, and the IGBT makes an energization period to the flash lamp to be 0.01 millisecond or more and 1 millisecond or less, consequently making a flash light irradiation time to be 0.01 millisecond or more and 1 millisecond or less. Since a flash heat treatment is performed with a remarkably short flash light irradiation time, the excessive heating of the thin film of amorphous silicon is suppressed and harmful influence such as the exfoliation of the film is prevented.

1 Claim, 5 Drawing Sheets

F I G . 2
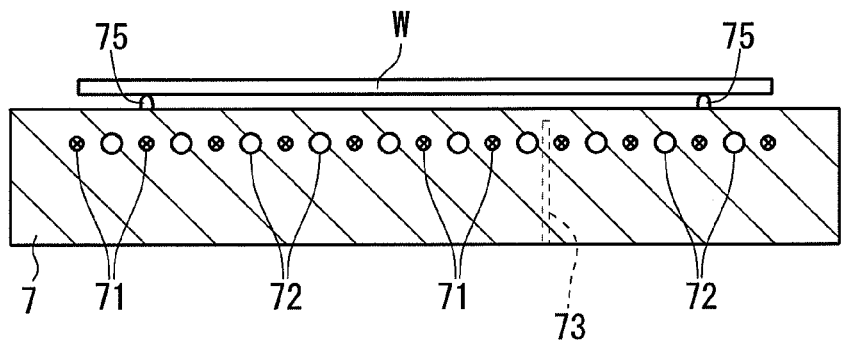
F I G . 3
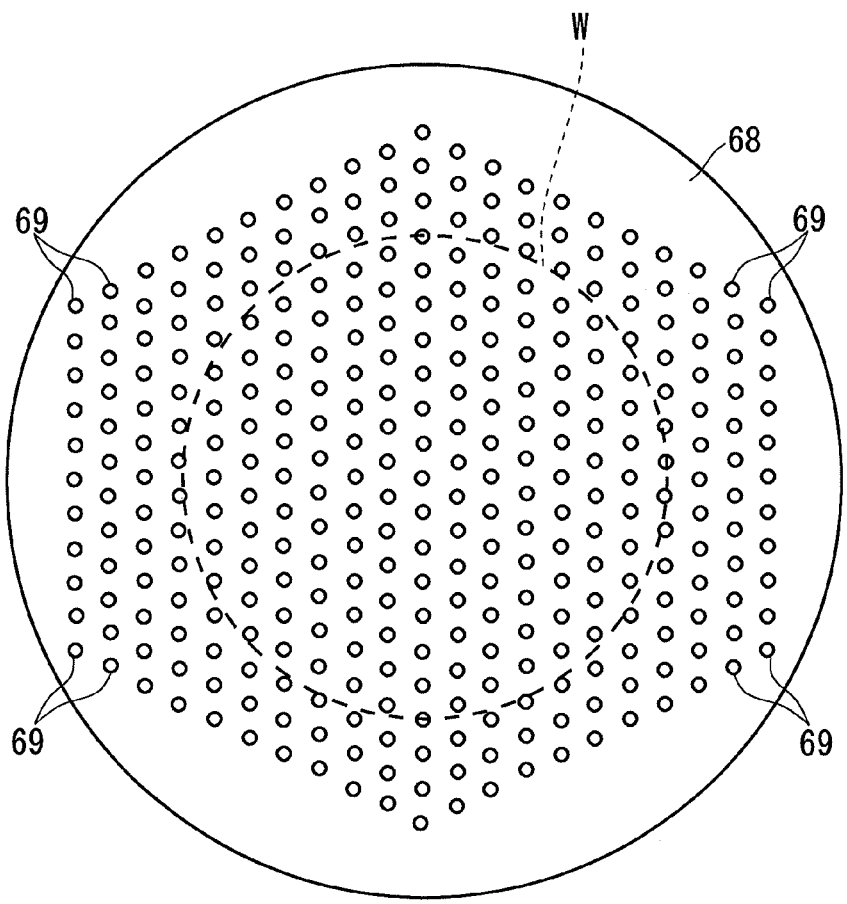

HEAT TREATMENT METHOD AND HEAT TREATMENT APPARATUS OF THIN FILM

BACKGROUND OF THE INVENTION

1. Field of the Invention

The present invention relates to a heat treatment method and a heat treatment apparatus for performing the heat treatment of a thin film which is formed on a base material including a semiconductor wafer, a glass substrate for a liquid crystal display device and the like and which is made of material different from that of the base material.

2. Description of the Background Art

In a manufacturing process of a semiconductor device, introduction of impurities is an indispensable process for forming a PN junction in a semiconductor wafer. Now, the introduction of impurities is generally conducted by an ion implantation method and a subsequent annealing method. The ion implantation method is a technique in which ionized impurity elements such as boron (B), arsenic (As), and phosphorus (P) are physically injected by colliding them with a semiconductor wafer with a high acceleration voltage. Injected impurities are activated by an annealing treatment. In this case, when an annealing time is about several seconds or more, the injected impurities are deeply diffused through heat, and consequently there is a possibility that a junction depth becomes much deeper than a required value, which may cause trouble in forming a good device.

Accordingly, flash lamp annealing (FLA) has attracted attention in recent years as an annealing technique for heating a semiconductor wafer for quite a short time. The flash lamp annealing is a heat treatment technique in which only the surface of a semiconductor wafer, where impurities are injected, is heated up for quite a short time (several milliseconds or less), by irradiating the surface of the semiconductor wafer with flash light using a xenon flash lamp (hereinafter, just a "flash lamp" refers to a xenon flash lamp).

The radiation spectral distribution of the xenon flash lamp ranges from an ultraviolet region to a near-infrared region, and its wavelengths are shorter than those of a conventional halogen lamp and are mostly in agreement with the fundamental absorption band of a silicon semiconductor wafer. Therefore, when being irradiated with flash light from the xenon flash lamp, the semiconductor wafer can be quickly heated up because the amount of transmitted light is small. Furthermore, it has been proven that only the vicinity of the semiconductor's surface can be selectively heated up when flash light irradiation is performed for quite a short time of about several milliseconds. For this reason, when temperature is raised in an ultra-short time by the xenon flash lamp, only impurities can be activated without diffusing the impurities deeply.

As a heat treatment apparatus using such a xenon flash lamp, US2006/0291835 discloses an apparatus in which a semiconductor wafer is placed on a hot plate to be preheated to a predetermined temperature and then is heated up to a desired treatment temperature by flash light irradiation from the flash lamp. Furthermore, a heat treatment of a film, which is formed on the surface of a semiconductor wafer, by using flash light irradiation is attempted, and Japanese Patent Application Laid-Open No. 2001-332484 discloses that edge roughness is improved by performing flash light irradiation on a resist film after a development processing procedure.

In the art disclosed in Japanese Patent Application Laid-Open No. 2001-332484, the resist film is formed on a silicon semiconductor wafer, and a flash heat treatment is performed for the resist film. Furthermore, an amorphous silicon (non-crystalline silicon) or poly-silicon (polycrystalline silicon) thin film is formed on a silicon dioxide ($SiO_2$) base material, and the flash heat treatment of the thin film is attempted to promote crystallization.

Thus, when a flash heat treatment is performed for a thin film which is formed on a base material and is made of material different from that of the base material, particularly when the flash heat treatment is performed for a silicon thin film formed on a base material such as silicon dioxide with relatively small thermal conductivity, thermal conduction is hardly produced from the thin film to the base material. For this reason, even if flash light irradiation is performed for quite a short time of about several milliseconds, exfoliation of a film or thermal damage in the film itself may arise because the film is excessively heated.

SUMMARY OF THE INVENTION

The present invention is directed to a heat treatment method for performing the heat treatment of a thin film which is formed on a base material and is made of material different from that of the base material.

In an aspect of the present invention, the heat treatment method includes the steps of: (a) accommodating a base material, on which a thin film is formed, in a chamber and holding the base material; and (b) heating the thin film by irradiating the thin film with flash light with an irradiation time of 0.01 millisecond or more and 1 millisecond or less.

The flash light irradiation time is quite short, which can suppress the excessive heating of the thin film during the flash heat treatment.

The present invention is also directed to a heat treatment apparatus for performing the heat treatment of a thin film which is formed on a base material and is made of material different from that of the base material.

In another aspect of the present invention, the heat treatment apparatus includes: a chamber that accommodates a base material on which a thin film is formed; a holding part that holds the base material in the chamber; a flash lamp that irradiates the base material held by the holding part with flash light; and a light emission controlling part that makes a flash light irradiation time of the flash lamp to be 0.01 millisecond or more and 1 millisecond or less.

The flash light irradiation time is quite short, which can suppress the excessive heating of the thin film during the flash heat treatment.

Therefore, an object of the present invention is to suppress the excessive heating of a thin film during the flash heat treatment.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a cross-sectional view showing a configuration of a holding plate;

FIG. 3 is a plan view of a blowoff plate;

DESCRIPTION OF THE PREFERRED EMBODIMENTS

Preferred embodiments of the present invention will now be described in detail with reference to the drawings.

First Preferred Embodiment

Figure 1:
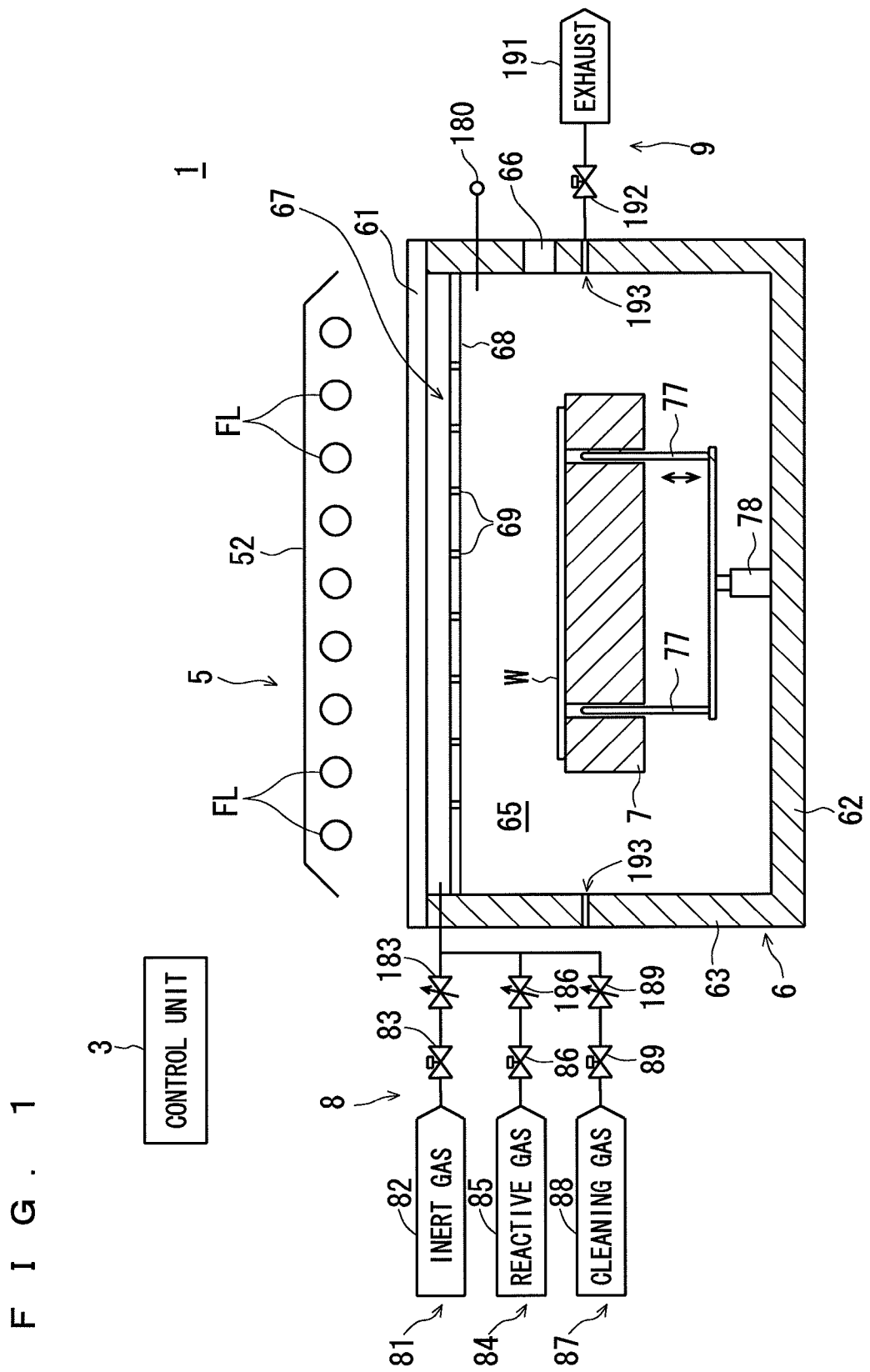
FIG. 1 is a view showing a configuration of essential parts of a heat treatment apparatus according to the present invention.

FIG. 1 is a view showing a configuration of essential parts of a heat treatment apparatus 1 according to the present invention. This heat treatment apparatus 1 is a flash lamp annealing apparatus that performs the heat treatment of a thin film by applying flash light to an object in which the amorphous silicon thin film is formed on a silicon dioxide ($SiO_2$) film fabricated on the surface of a semiconductor wafer W having a substantially circular shape. In FIG. 1 and each of the subsequent figures, the drawings are exaggerated or simplified in size and number for each part, if necessary, for ease of understanding.

As a main configuration, the heat treatment apparatus 1 includes: a chamber 6 that accommodates a semiconductor wafer W and has a substantially cylindrical shape; a holding plate 7 that holds the semiconductor wafer W in the chamber 6; a flash irradiating part 5 that irradiates the semiconductor wafer W in the chamber 6 with flash light; a gas supplying unit 8 that supplies a treating gas into the chamber 6; and an exhaust unit 9 that performs exhaust from the chamber 6. The heat treatment apparatus 1 also includes a control unit 3 that controls each of these parts so as to perform the firing treatment of a thin film.

The chamber 6 is provided under the flash irradiating part 5 and includes a chamber flank 63 with a substantially cylindrical inner wall and a chamber bottom 62 that covers the lower part of the chamber flank 63. A space surrounded by the chamber flank 63 and the chamber bottom 62 is specified as a heat treating space 65.

A chamber window 61, which blocks up the chamber 6, is mounted on the upper opening of the chamber 6. The chamber window 61 that constitutes the ceiling part of the chamber 6 is a disc shaped member made of quartz and functions as a quartz window that transmits flash light emitted from the flash irradiating part 5 to the heat treating space 65. The chamber bottom 62 and the chamber flank 63 that constitute the main body of the chamber 6 are formed of metallic material, which is excellent in mechanical strength and thermal resistance, such as stainless steel, for example.

The chamber window 61 and the chamber flank 63 are sealed with an O-ring, not shown in the figure, to maintain the air-tightness of the heat treating space 65. That is, the O-ring is inserted between the underface circumferential edge part of the chamber window 61 and the chamber flank 63, which prevents gas from flowing in or out through these chinks.

A conveyance opening 66 for carrying in and carrying out a semiconductor wafer W is provided on the chamber flank 63. The conveyance opening 66 can be opened or closed by a gate valve, which is not shown in the figure. When the conveyance opening 66 is opened, the carrying in and carrying out of a semiconductor wafer W to the chamber 6 can be attained by a transfer robot, which is not shown in the figure. When the conveyance opening 66 is closed, the heat treating space 65 becomes a closed space where airflow with the exterior is intercepted.

The holding plate 7 is a metallic member, for example aluminum, with a substantially disc shape. The holding plate 7, on which a semiconductor wafer W is placed, holds the semiconductor wafer W in a horizontal position (that is, in a position in which the normal direction of the main surface is parallel with the vertical direction) in the chamber 6. FIG. 2 is a cross-sectional view showing a configuration of a holding plate 7. A heater 71 and a water cooled tube 72 are built into the holding plate 7. The heater 71 is formed of a resistance heating line such as a nichrome wire and generates heat by receiving electric power supply from a power supply source, not shown in the figure, to heat the holding plate 7. The water cooled tube 72 cools the holding plate 7, as cooling water supplied from a cooling water supply source, not shown in the figure, flows.

The heater 71 and the water cooled tube 72 are both provided so that they may go around inside the holding plate 7. The heater 71 and the water cooled tube 72 are provided such that they are formed with a uniform arranging density for at least a region facing a semiconductor wafer W to be placed in the entire area of the holding plate 7. For this reason, the heater 71 and the water cooled tube 72 can uniformly heat and cool the region concerned, respectively. The amount of power supply to the heater 71 and the amount of cooling water supply to the water cooled tube 72 are controlled by the control unit 3.

Inside the holding plate 7, a temperature sensor 73 configured by using a thermocouple is disposed. The temperature sensor 73 measures temperature in the vicinity of the upper face of the holding plate 7. A result measured by the temperature sensor 73 is transmitted to the control unit 3. Plural temperature sensors 73 may be provided in a region facing a semiconductor wafer W placed on the holding plate 7.

Plural proximity balls 75 (three proximity balls in this preferred embodiment) made of a member such as alumina ($Al_2O_3$) are disposed on the upper face of the holding plate 7. The three proximity balls 75 are disposed in a state where the upper ends of the proximity balls project by a very small amount from the upper face of the holding plate 7. For this reason, when a semiconductor wafer W is supported by the three proximity balls 75, a fine interval, so called a proximity gap, is formed between the rear face of the semiconductor wafer W, and the upper face of the holding plate 7. A susceptor may be installed on the upper face of the holding plate 7 such that the susceptor supports the semiconductor wafer W.

The temperature of the semiconductor wafer W placed on the holding plate 7 via the three proximity balls 75 is controlled at a predetermined temperature by the heater 71 and the water cooled tube 72. That is, the heater 71 heats the semiconductor wafer W held by the holding plate 7 and the water cooled tube 72 cools the semiconductor wafer W, consequently the temperature of the semiconductor wafer W being controlled at the predetermined temperature.

When the temperature of the semiconductor wafer W held by the holding plate 7 is controlled, the amount of power supply to the heater 71 and the amount of cooling water supply to the water cooled tube 72 are controlled by the control unit 3 so that the temperature of the holding plate 7 measured by the temperature sensor 73 may coincide with a predetermined temperature set in advance. That is, the temperature control of the holding plate 7 by the control unit 3 is feedback control, and more specifically, it is conducted by PID (Proportional Integral Derivative) control.

In this preferred embodiment, since both the heater 71 that is heating means and the water cooled tube 72 that is cooling means are provided inside the holding plate 7, the temperature of the semiconductor wafer W held by the holding plate 7 can be controlled in a wide temperature range from room temperature to about 500° C., due to the collaboration of the heating means and the cooling means.

Returning to FIG. 1, plural lift pins 77 (three lift pins in this preferred embodiment) are provided, which appear and disappear on the upper face of the holding plate 7. The upper end's height positions of the three lift pins 77 are included in an identical horizontal plane. The three lift pins 77 go up and down together along the vertical direction by an air cylinder 78. Each of the lift pins 77 goes up and down along the inner side of an insertion hole which is provided such that the insertion hole penetrates the holding plate 7 in the vertical direction. When the air cylinder 78 makes the three lift pins 77 go up, the tip of each lift pin 77 projects from the upper face of the holding plate 7. When the air cylinder 78 makes the three lift pins 77 go down, the tip of each lift pin 77 gets embedded in the insertion hole of the holding plate 7.

A blowoff plate 68 is provided above the heat treating space 65 and directly below the chamber window 61. FIG. 3 is a plan view of the blowoff plate 68. The blowoff plate 68 is a disc shaped member made of quartz and is installed in a horizontal position such that the blowoff plate 68 faces the surface of the semiconductor wafer W held by the holding plate 7. As shown in FIG. 3, the blowoff plate 68 is provided with many drilled discharge holes 69. Specifically, plural discharge holes 69 are drilled with a uniform density at least in a region, which faces the surface of the semiconductor wafer W held by the holding plate 7, of the blowoff plate 68.

The gas supplying unit 8 supplies a treating gas to a gas reservoir space 67 formed between the chamber window 61 and the blowoff plate 68. The gas supplying unit 8 according to the preferred embodiment has an inert gas feed section 81, a reactive gas feed section 84, and a cleaning gas feed section 87. The inert gas feed section 81 is provided with an inert gas supply source 82, a valve 83, and a flow control valve 183, and supplies an inert gas to the gas reservoir space 67 by opening the valve 83. The flow amount of the inert gas supplied by the inert gas feed section 81 is adjusted by the flow control valve 183.

The reactive gas feed section 84 is provided with a reactive gas supply source 85, a valve 86, and a flow control valve 186, and supplies a reactive gas to the gas reservoir space 67 by opening the valve 86. The flow amount of the reactive gas supplied by the reactive gas feed section 84 is adjusted by the flow control valve 186.

Similarly, the cleaning gas feed section 87 is provided with a cleaning gas supply source 88, a valve 89, and a flow control valve 189, and supplies a cleaning gas to the gas reservoir space 67 by opening the valve 89. The flow amount of the cleaning gas supplied by the cleaning gas feed section 87 is adjusted by the flow control valve 189. The inert gas supply source 82, the reactive gas supply source 85, and the cleaning gas supply source 88 may be constituted of gas tanks and feed pumps provided in the heat treatment apparatus 1, or the utility of a factory, in which the heat treatment apparatus 1 is installed, may be used.

The gas supplying unit 8 can supply a mixed gas to the gas reservoir space 67 of the chamber 6 by opening two or more of the three valves 83, 86 and 89. For example, the gas supplying unit 8 can supply a mixed gas, which is a mixture of a reactive gas and an inert gas, into the chamber 6 by opening both of the valve 83 and the valve 86.

Here, an "inert gas" is a gas that lacks in reactivity with the material of a thin film and a semiconductor wafer W (silicon in this preferred embodiment), and includes nitrogen ($N_2$), argon (Ar), helium (He) and the like. A "reactive gas" is a gas that is rich in reactivity with a thin film formed on a base material, and includes oxygen ($O_2$), hydrogen ($H_2$), chlorine ($Cl_2$), water vapor ($H_2O$), hydrogen chloride (HCl), ozone ($O_3$), ammonia ($NH_3$) and the like, as well as a bromine (Br) compound gas and a fluoride (F) compound gas. However, depending on the purpose of a heat treatment in the heat treatment apparatus 1, nitrogen can not only serve as an inert gas but also as a reactive gas.

A "cleaning gas" is a gas that reacts with contaminant adhering in the chamber 6 as mentioned later, and includes oxygen ($O_2$), hydrogen ($H_2$), chlorine ($Cl_2$), water vapor ($H_2O$), hydrogen chloride (HCl), ozone ($O_3$), a fluoride (F) compound gas and the like. In this specification, these inert gases, reactive gases, and cleaning gases are generically named as a "treating gas" for treatment. A reactive gas and a cleaning gas include a common type of gas, and either of the reactive gas feed section 84 and the cleaning gas feed section 87 may be used for two purposes.

The treating gas, which is supplied from the gas supplying unit 8 to the gas reservoir space 67, is discharged downward from the plural discharge holes 69 drilled in the blowoff plate 68. At this time, since the passage resistance of fluid in the gas reservoir space 67 is smaller than that in the discharge holes 69, the treating gas supplied from the gas supplying unit 8 once flows while spreading in the gas reservoir space 67 and then is discharged uniformly from the plural discharge holes 69. The plural discharge holes 69 are provided with a uniform density in a region facing the semiconductor wafer W held by the holding plate 7. Therefore, the treating gas is sprayed uniformly from the blowoff plate 68 on the entire surface of the semiconductor wafer W held by the holding plate 7.

The exhaust unit 9 is provided with an exhaust device 191 and a valve 192, and exhausts an atmosphere in the chamber 6 from exhaust ports 193 by opening the valve 192. The exhaust ports 193 are slits formed on the chamber flank 63 such that the slits surround the holding plate 7. The height position at which the exhaust ports 193 are formed is same as the height position of the semiconductor wafer W held by the holding plate 7 or lower, and is preferably slightly lower than the height position of the semiconductor wafer W. The exhaust unit 9 performs exhaust from the slit-shaped exhaust ports 193, which is formed such that the exhaust ports 193 surround the holding plate 7, and consequently a gas is discharged uniformly from the surroundings of the semiconductor wafer W held by the holding plate 7.

As the exhaust device 191, a vacuum pump or the exhaust utility of a factory, in which the heat treatment apparatus 1 is installed, can be used. When a vacuum pump is employed as the exhaust device 191 and the atmosphere of the heat treating space 65, which is a closed space, is exhausted without supplying a treating gas from the gas supplying unit 8, the internal space of the chamber 6 can be decompressed even to a vacuum atmosphere. Even when a vacuum pump is not used as the exhaust device 191, by performing exhaust without supplying a treating gas from the gas supplying unit 8, the inner space of the chamber 6 can be decompressed to an atmosphere with a pressure lower than the atmospheric pressure.

A concentration sensor 180 is provided in the chamber 6 of the heat treatment apparatus 1. When a mixed gas containing an inert gas and a reactive gas is supplied into the chamber 6, the concentration sensor 180 measures the concentration of the reactive gas in the mixed gas in the heat treating space 65.

The flash irradiating part 5 is provided above the chamber 6. The flash irradiating part 5 includes a light source, which includes plural flash lamps FL (thirty flash lamps are used in this preferred embodiment, but only nine flash lamps are shown in FIG. 1 for graphical convenience), and a reflector 52 that is provided such that the reflector 52 covers the upper portion of the light source. The flash irradiating part 5 irradiates the semiconductor wafer W, which is held by the holding plate 7 in the chamber 6, with flash light from the flash lamps FL via the quartz chamber window 61 and the blowoff plate 68.

The plural flash lamps FL are rod-shaped lamps, each of which has a lengthy cylindrical shape, and the longitudinal direction of each flash lamp is arranged along the main surface (that is, along the horizontal direction) of the semiconductor wafer W held by the holding plate 7, with each flash lamp arranged in parallel with each other in a plane form. Therefore, a plane formed by the arrangement of the flash lamps FL is also a horizontal plane.

Figure 4:
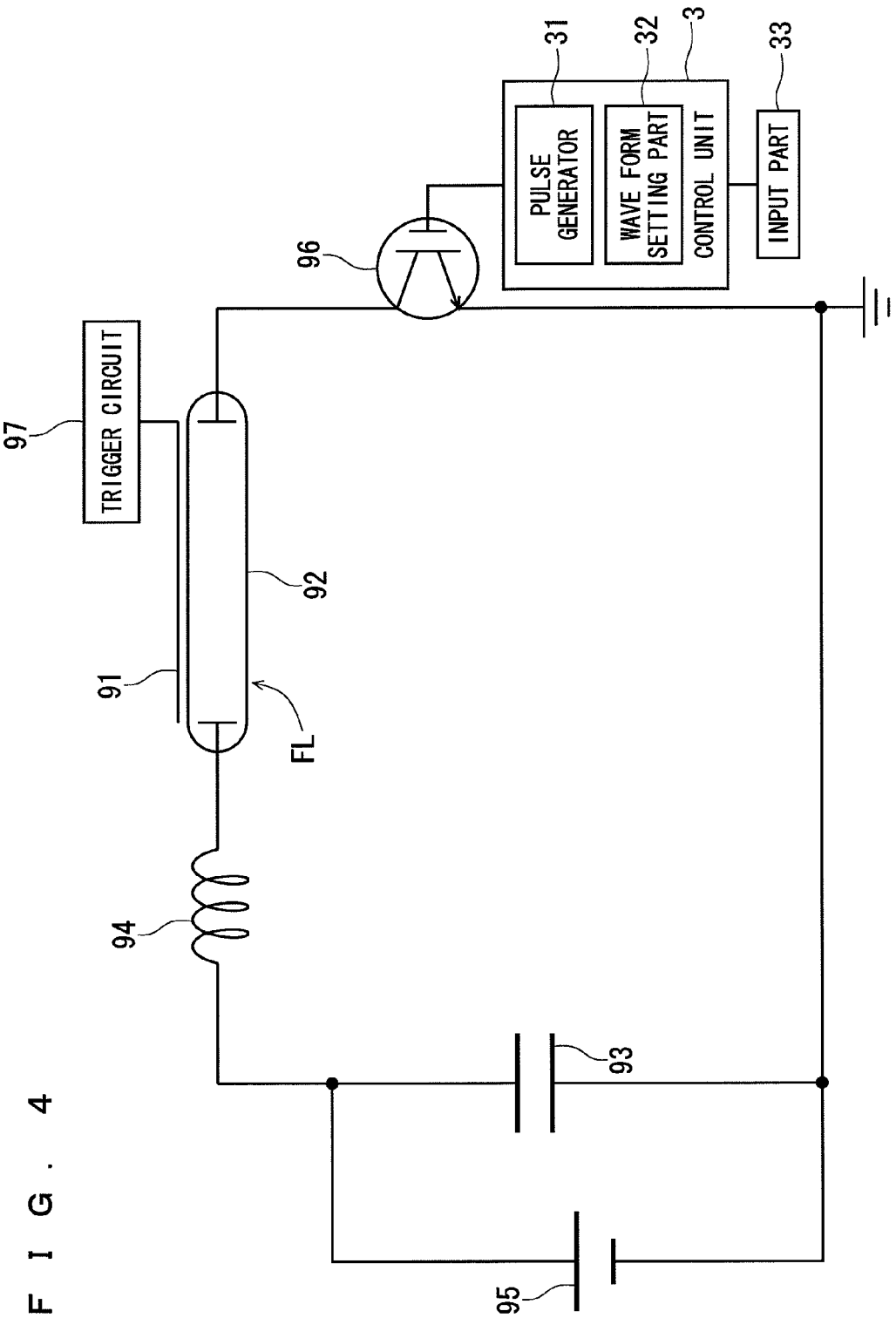
FIG. 4 is a diagram showing a drive circuit of a flash lamp.

FIG. 4 is a diagram showing a drive circuit of a flash lamp FL. As shown in the figure, a capacitor 93, a coil 94, a flash lamp FL and an IGBT (Insulated Gate Bipolar Transistor) 96 are connected in series. As shown in FIG. 4, the control unit 3 is provided with a pulse generator 31 and a waveform setting part 32, and is also connected to an input part 33. As the input part 33, various publicly known input devices such as a keyboard, a mouse, and a touch panel can be employed. The waveform setting part 32 sets the waveform of a pulse signal based on input content from the input part 33, and the pulse generator 31 generates a pulse signal according to the waveform.

In this preferred embodiment, a xenon flash lamp is used as the flash lamp FL. The flash lamp FL includes a rod-shaped glass tube (discharge tube) 92, in which a xenon gas is enclosed and at both ends of which an anode and a cathode are disposed, and a trigger electrode 91 that is attached on the outer face of the glass tube 92. A predetermined voltage is applied to the capacitor 93 by a power supply unit 95, and electric charge is charged according to the applied voltage (charging voltage). A high voltage can be applied to the trigger electrode 91 from a trigger circuit 97. Timing when the trigger circuit 97 applies a voltage to the trigger electrode 91 is controlled by the control unit 3.

The IGBT 96 is a bipolar transistor that includes a MOSFET (Metal Oxide Semiconductor Field Effect Transistor) in a gate part, and is a switching element suitable in dealing with large electric power. A pulse signal is applied to the gate of the IGBT 96 from the pulse generator 31 of the control unit 3. When a voltage (High voltage) higher than a predetermined value is applied to the gate of the IGBT 96, the IGBT 96 turns to be an ON-state, and when a voltage (Low voltage) lower than the predetermined voltage is applied, the IGBT 96 turns to be an OFF-state. In this manner, the drive circuit including the flash lamp FL is turned on and off by the IGBT 96. With the IGBT 96 turned on and off, connection between the flash lamp FL and the corresponding capacitor 93 is intermittent.

Even when the IGBT 96 turns to be ON-state with the capacitor 93 being charged and when a high voltage is applied to the both ends' electrodes of the glass tube 92, since a xenon gas is an electrical insulator, an electric current does not flow through the glass tube 92 in a normal state. However, when the trigger circuit 97 applies a high voltage to the trigger electrode 91 to cause dielectric breakdown, an electric current instantaneously flows through the glass tube 92 due to electric discharge between the both ends' electrodes, and light is emitted due to the excitation of a xenon atom or a xenon molecule that occurs at that time.

The reflector 52 is provided above the plural flash lamps FL such that the reflector 52 covers the whole of the plural flash lamps FL. The fundamental function of the reflector 52 is to reflect the flash light emitted from the plural flash lamps FL toward the side of the holding plate 7. The reflector 52 is formed of an aluminum alloy plate, and on the surface of the reflector (the surface facing the flash lamps FL) roughening processing is performed by blasting, resulting in a satin finished surface.

The control unit 3 controls the above mentioned various motion mechanisms provided in the heat treatment apparatus 1. The configuration of the control unit 3 as hardware is the same as that of a common computer. That is, the control unit 3 includes a CPU that performs various arithmetic processing, a ROM that is a read-only memory memorizing a basic program, a RAM that is a readable and writable memory memorizing a variety of information, and a magnetic disk that memorizes software for control, data and the like. With the CPU of the control unit 3 executing a predetermined treatment program, a treatment in the heat treatment apparatus 1 proceeds. As shown in FIG. 4, the control unit 3 is provided with the pulse generator 31 and the waveform setting part 32. As mentioned above, based on the input content from the input part 33, the waveform setting part 32 sets the waveform of a pulse signal, and the pulse generator 31 outputs a pulse signal to the gate of the IGBT 96 according to the waveform of the pulse signal.

Figure 5:
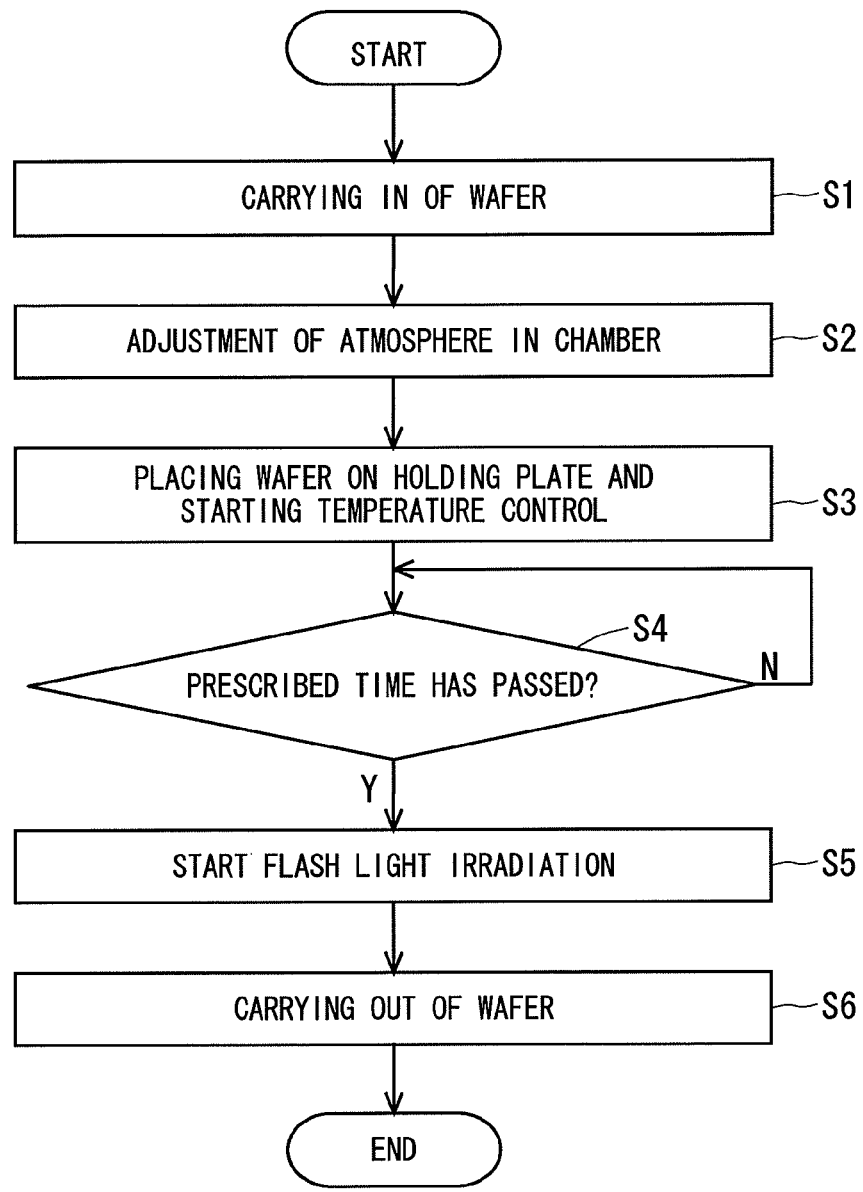
FIG. 5 is a flow chart showing a treatment procedure of a semiconductor wafer in the heat treatment apparatus in FIG. 1.

Next, the treatment procedure of the semiconductor wafer W in the heat treatment apparatus 1, which has the above-mentioned configuration, will be described. FIG. 5 is a flow chart showing the treatment procedure of the semiconductor wafer W in the heat treatment apparatus 1. With the control unit 3 controlling each motion mechanism of the heat treatment apparatus 1, the treatment procedure of the heat treatment apparatus 1 described below proceeds.

Figure 6:
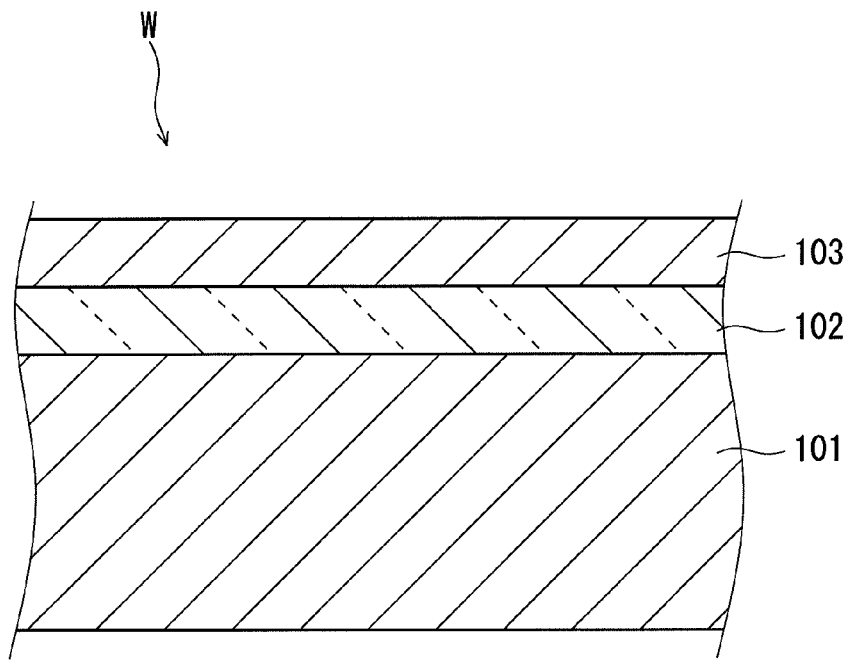
FIG. 6 is a view showing a cross section structure of a semiconductor wafer to be treated.

First, with the gate valve, not shown in the figure, opened, the conveyance opening 66 is opened, and then a semiconductor wafer W to be treated is carried into the chamber 6 via the conveyance opening 66 by the transfer robot outside the apparatus (Step S1). FIG. 6 is a view showing the cross section structure of the semiconductor wafer W to be treated. In the semiconductor wafer W to be treated in the first preferred embodiment, the silicon dioxide base material 102 is formed on the surface of silicon substrate 101 and an amorphous silicon thin film 103 is formed on the base material 102. That is, on the silicon dioxide base material 102, the amorphous silicon thin film 103 is formed, which is different material from that of the base material 102. The silicon dioxide base material 102 and the amorphous silicon thin film 103 are formed by another apparatus separated from the heat treatment apparatus 1, and the semiconductor wafer W for which the film formation has completed is carried into the chamber 6 of the heat treatment apparatus 1.

The transfer robot's hand, which holds the semiconductor wafer W on which the silicon dioxide base material 102 and the amorphous silicon thin film 103 are formed in this order, enters from the conveyance opening 66 into the chamber 6, and stops right above the holding plate 7. Then, three lift pins 77 go up and receive the semiconductor wafer W from the hand. And then, after the transfer robot's hand leaves the chamber 6 and the conveyance opening 66 is also closed, the heat treating space 65 in the chamber 6 is made into a closed space.

After the heat treating space 65 is made into a closed space, the adjustment of atmosphere in the chamber 6 is performed (Step S2). In this preferred embodiment, since the amorphous silicon thin film 103 is heat treated to be crystallized, while nitrogen gas is supplied from the gas supplying unit 8 into the chamber 6, the exhaust unit 9 performs exhaust from the chamber 6. The nitrogen gas supplied to the gas reservoir space 67 from the gas supplying unit 8 flows down towards the semiconductor wafer W located below from the plural discharge holes 69 of the blowoff plate 68. A gas flow is formed in the chamber 6 such that the nitrogen gas flowing down from the upper part is discharged from the surroundings of the semiconductor wafer W by the exhaust unit 9. Thus, the heat treating space 65 in the chamber 6 becomes a nitrogen atmosphere. As a measure to improve the efficiency of substitution from an air atmosphere to a nitrogen atmosphere in the heat treating space 65, while the exhaust unit 9 performs exhaust from the heat treating space 65 without supplying nitrogen from the gas supplying unit 8, the internal space of the chamber 6 may be once decompressed to an atmosphere with a pressure lower than the atmospheric pressure.

Next, the three lift pins 77 supporting the semiconductor wafer W go down, and get embedded in the insertion holes of the holding plate 7. In a process in which the lift pins 77 go down, the semiconductor wafer W is transferred from the lift pins 77 to the upper face of the holding plate 7, and is placed and held on the upper face of the holding plate 7.

The temperature of the holding plate 7 is controlled at a predetermined temperature in advance by the heater 71 and the water cooled tube 72. The temperature of the holding plate 7 can be controlled properly according to the kind of a thin film 103 and the purpose of a heat treatment. Based on the measured results of the temperature sensor 73, the control unit 3 controls the amount of electric power supply to the heater 71 and the amount of cooling water supply to the water cooled tube 72 so that the temperature of the holding plate 7 may coincide with the predetermined control temperature. Thus, the temperature of the upper face of holding plate 7 is also maintained at the predetermined control temperature.

When the lift pins 77 go down and the semiconductor wafer W is placed on the holding plate 7, the temperature of which is controlled at the predetermined temperature, temperature control for the semiconductor wafer W is started by controlling the holding plate 7, strictly speaking, by controlling the heater 71 and the water cooled tube 72 (Step S3). Thus, the temperature of the semiconductor wafer W is raised gradually from room temperature to the predetermined control temperature, and is maintained at the predetermined control temperature.

After the semiconductor wafer W is placed and held on the holding plate 7, there is a predetermined waiting-time (Step S4). During this time, the temperature of the entire semiconductor wafer W, which includes the silicon dioxide base material 102 and the amorphous silicon thin film 103, is accurately controlled at the control temperature of the holding plate 7. At a time when a predetermined time has passed since the lift pins 77 went down and the temperature control of the semiconductor wafer W was started, flash light is applied from the flash lamps FL of the flash irradiating part 5 toward the semiconductor wafer W held by the holding plate 7 under the control of the control unit 3 (Step S5). When the flash lamp FL performs flash light irradiation, electric charge is stored in the capacitor 93 in advance by the power supply unit 95. With electric charge stored in the capacitor 93, a pulse signal is outputted from the pulse generator 31 of the control unit 3 to the IGBT 96 to perform the ON-OFF drive of the IGBT 96.

The waveform of the pulse signal is specified by inputting a recipe, in which the time of a pulse width (ON time) and the time of a pulse spacing (OFF time) are sequentially set as a parameter, from the input part 33. In this preferred embodiment, an ON time of 0.01 millisecond or more and of 1 millisecond or less and a subsequent arbitrary OFF time are set. That is, the operator of the apparatus inputs the recipe, in which one pulse having the width of 0.01 millisecond or more and of 1 millisecond or less is set, from the input part 33. When such a recipe is inputted from the input part 33 into the control unit 3, the waveform setting part 32 of the control unit 3 set a pulse waveform for one pulse, the width of which is 0.01 millisecond or more and is 1 millisecond or less, according to the recipe. According to the pulse waveform set by the waveform setting part 32, the pulse generator 31 outputs a pulse signal. As a result, the pulse signal for one pulse, the width of which is 0.01 millisecond or more and is 1 millisecond or less, is applied to the gate of the IGBT 96, and the ON-OFF drive of IGBT 96 is controlled. Specifically, when the pulse signal inputted to the gate of the IGBT 96 is ON, the IGBT 96 turn to be an ON-state, and when the pulse signal is OFF, the IGBT 96 turns to be an OFF-state. In this preferred embodiment, since the pulse signal for one pulse, the width of which is 0.01 millisecond or more and is 1 millisecond or less, is applied to the gate of the IGBT 96, the IGBT 96 first turns to be an ON-state for 0.01 millisecond or more and 1 millisecond or less and then turns to be an OFF-state.

Synchronizing with timing when the pulse signal outputted from the pulse generator 31 is turned on, the control unit 3 controls the trigger circuit 97 so that a high voltage (trigger voltage) may be applied to the trigger electrode 91. With electric charge stored in the capacitor 93, a pulse signal is inputted to the gate of the IGBT 96. In addition, synchronizing the timing when the pulse signal is turned on, a high voltage is applied to the trigger electrode 91. As a result, when the pulse signal is turned on, an electric current flows between the both ends' electrodes in the glass tube 92, and light is emitted due to the excitation of a xenon atom or a xenon molecule that occurs at that time.

Thus, while the control unit 3 outputs the pulse signal for one pulse, the width of which is 0.01 millisecond or more and is 1 millisecond or less, to the gate of the IGBT 96, synchronizing with the timing when the pulse signal is turned on, a high voltage is applied to the trigger electrode 91. As a result, an electric current flows through the flash lamp FL and flash light is radiated. When the pulse signal is turned off, the IGBT 96 also turns to be an OFF-state, and the electric current flowing through the flash lamp FL is stopped and the radiation of flash light is also stopped. In this manner, with an electric current flowing through the flash lamp FL with an energization period of 0.01 millisecond or more and 1 millisecond or less, the emission time of the flash lamp FL is made to be 0.01 millisecond or more and 1 millisecond or less.

Figure 7:
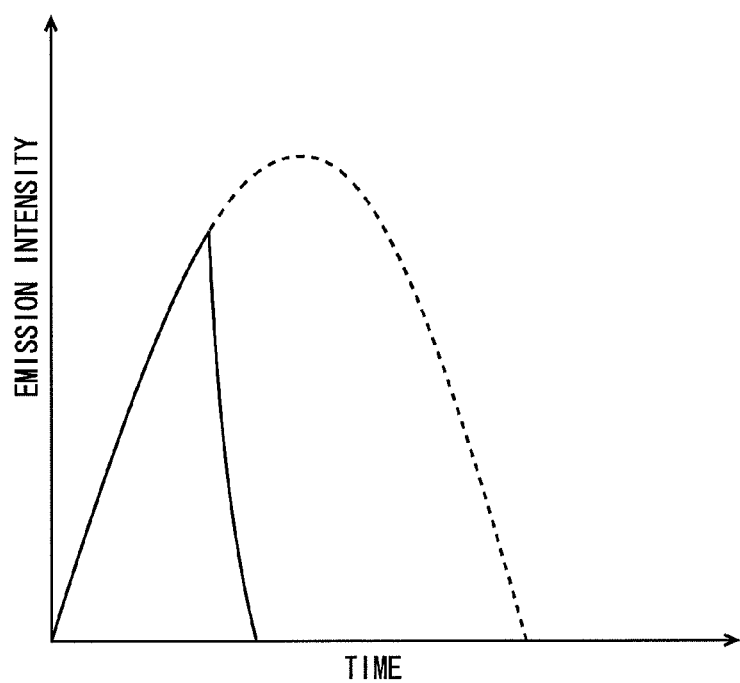
FIG. 7 is a diagram explaining the light emission time control of a flash lamp.

FIG. 7 is a diagram explaining the light emission time control of a flash lamp FL. When the flash lamp FL is made emit light without using the IGBT 96, most electric charge stored in the capacitor 93 is consumed at one time, and the waveform of the emission intensity of the flash lamp FL becomes like a dotted line shown in FIG. 7. The emission time of the flash lamp FL in this case is about several milliseconds in general, although it is dependent on the inductance of the coil 94.

In this preferred embodiment, the IGBT 96, i.e., a switching element, is connected in a circuit that includes the flash lamp FL, and a pulse signal for one pulse, the width of which is 0.01 millisecond or more and is 1 millisecond or less, is outputted to the gate of the IGBT 96. Thus, the supply of electric charge from the capacitor 93 to the flash lamp FL is intermitted by the IGBT 96, and a time period while an electric current is flowing through the flash lamp FL is controlled to be 0.01 millisecond or more and 1 millisecond or less. The flash lamp FL emits light, only while an electric current is flowing between the both ends' electrodes of the flash lamp FL. That is, with the IGBT 96 making the energization period to the flash lamp FL to be 0.01 millisecond or more and 1 millisecond or less, the waveform of the emission intensity of the flash lamp FL becomes like a solid line shown in FIG. 7, and the emission time is also 0.01 millisecond or more and 1 millisecond or less.

A part of the flash light radiated from the flash lamp FL directly goes toward the holding plate 7 in the chamber 6, and another part is once reflected from the reflector 52 and then goes toward the inside of the chamber 6. By irradiation of such flash light with an irradiation time of 0.01 millisecond or more and 1 millisecond or less, the amorphous silicon thin film 103 formed on the silicon dioxide base material 102 is flash-heated, and its temperature is raised to a treating temperature. With this flash heating, the crystallization of the amorphous silicon thin film 103 is promoted.

After the flash heating is completed, while the semiconductor wafer W is held on the holding plate 7, there is a predetermined waiting-time. Then, three lift pins 77 go up, and thrust up the semiconductor wafer W placed on the holding plate 7 so that the semiconductor wafer W may be separated from the holding plate 7. After that, the conveyance opening 66 is opened again, and the transfer robot's hand enters from the conveyance opening 66 into the chamber 6 and stops directly below the semiconductor wafer W. With the lift pins 77 going down, the semiconductor wafer W is transferred from the lift pins 77 to the transfer robot. Lastly, with the transfer robot's hand that has received the semiconductor wafer W leaving the chamber 6, the semiconductor wafer W is carried out from the chamber 6, and the heat treatment of the thin film 103 in the heat treatment apparatus 1 is completed (Step S6).

In the first preferred embodiment, a flash heat treatment is performed by applying flash light from the flash lamp FL to the amorphous silicon thin film 103 formed on the silicon dioxide base material 102 fabricated on the surface of the semiconductor wafer W. At this time, with the IGBT 96 making the energization period to the flash lamp FL to be 0.01 millisecond or more and 1 millisecond or less, a flash light irradiation time is made to be 0.01 millisecond or more and 1 millisecond or less.

Since the flash light irradiation time is made to be 0.01 millisecond or more and 1 millisecond or less, which is remarkably shorter than conventional one (dotted line in FIG. 7), the excessive heating of the amorphous silicon thin film 103 is suppressed. As a result, as in the case of the first preferred embodiment in particular, even when flash heating is performed for the amorphous silicon thin film 103 formed on the silicon dioxide base material 102, which has a relatively small thermal conductivity, the excessive temperature rise of the thin film 103 is suppressed and obstruction to promoting the crystallization of amorphous silicon can be prevented while the exfoliation of the thin film 103 from the base material 102 is prevented. In particular, an attempt to make the thickness of the thin film 103 extremely thin (several nanometers to several tens nanometers) has been made in recent years, and the flash light irradiation time is preferably made to be 0.01 millisecond to 0.1 millisecond for suppressing the excessive temperature rise of such an extremely thin film 103.

Second Preferred Embodiment

Next, a second preferred embodiment of the present invention will be described. A configuration of a heat treatment apparatus of the second preferred embodiment is completely the same as that of the first preferred embodiment. A treatment procedure in the heat treatment apparatus of the second preferred embodiment is also almost the same as that of the first preferred embodiment.

In the second preferred embodiment, a thin film of a high-k material (high-dielectric-constant material) such as a hafnium (Hf) compound is formed on the surface of the semiconductor wafer W of silicon. In the second preferred embodiment, the semiconductor wafer W of silicon itself is a base material on which a thin film is formed. That is, on the semiconductor wafer W that is the base material of silicon, the thin film of the hafnium compound, which is made of different material from that of the base material, is formed. The thin film of the hafnium compound is formed by the atomic layer deposition (ALD) method using another apparatus separated from the heat treatment apparatus 1. A semiconductor wafer W, on which the thin film of the hafnium compound with a film thickness corresponding to the level of one atomic layer is formed by the atomic layer deposition method, is carried into the chamber 6 of the heat treatment apparatus 1.

Similarly to the first preferred embodiment, flash light irradiation is performed for the semiconductor wafer W, on which the thin film of the hafnium compound has been formed, with an irradiation time of 0.01 millisecond or more and 1 millisecond or less. That is, with the IGBT 96 making the energization period to the flash lamp FL to be 0.01 millisecond or more and 1 millisecond or less, the flash light irradiation time is made to be 0.01 millisecond or more and 1 millisecond or less. This flash heat treatment gives crystallinity to the thin film of the high-k material. By repeating film deposition by the atomic layer deposition method and flash heating in the heat treatment apparatus 1 in this manner, the thin film of the high-k material with a predetermined thickness is formed on the surface of the semiconductor wafer W.

In the second preferred embodiment, the electrical property (electrostatic capacitance) of the high-k material varies, depending on the atmosphere of the heat treating space 65 when a flash heat treatment is performed for the high-k material. For this reason, the nitrogen concentration and the oxygen concentration of the heat treating space 65 are controlled, in Step S2 of FIG. 5 when the flash heat treatment is performed, so that a desired electrical property may be given to the high-k material.

In more detail, when the film thickness of the high-k material is relatively thin and is smaller than a predetermined value, the flash heat treatment is performed in a mixed gas in which nitrogen is mixed with helium or argon. Specifically, while the reactive gas feed section 84 opens the valve 86 and supplies nitrogen gas as a reactive gas into the chamber 6, the inert gas feed section 81 opens the valve 83 and supplies helium or argon as an inert gas in the chamber 6. With both the valve 83 and the valve 86 opened, a mixed gas in which helium or argon as the inert gas is mixed with nitrogen as the reactive gas is supplied to the heat treating space 65 in the chamber 6.

The nitrogen concentration in the mixed gas in the heat treating space 65 in the chamber 6 is measured by the concentration sensor 180. A result measured by the concentration sensor 180 is transmitted to the control unit 3. The control unit 3 adjusts the concentration of the reactive gas so that the nitrogen concentration in the mixed gas in the heat treating space 65 may coincide with a predetermined value set in advance, based on the result measured by the concentration sensor 180. Specifically, when the measured result of the nitrogen concentration by the concentration sensor 180 is lower than the predetermined value, the control unit 3 controls the flow control valve 186 so as to increase the flow of nitrogen. On the contrary, when the measured result of the nitrogen concentration by the concentration sensor 180 is higher than the predetermined value, the control unit 3 controls the flow control valve 186 so as to decrease the flow of nitrogen. In this manner, the control unit 3 controls the flow control valve 186 and adjusts the flow of nitrogen gas as the reactive gas so that the measured result of the nitrogen concentration by the concentration sensor 180 may approach the predetermined value.

The nitrogen concentration in the mixed gas in the heat treating space 65 may be adjusted by adjusting the flow of helium or argon as the inert gas, instead by adjusting the flow of nitrogen as the reactive gas. The nitrogen concentration in the mixed gas may also be adjusted by adjusting both the flows of the reactive gas and the inert gas.

With the nitrogen concentration, which is adjusted in this manner, in the mixed gas in the heat treating space 65 being coincident with the predetermined value set in advance, flash light is applied from the flash lamp FL to the surface of the semiconductor wafer W with the irradiation time of 0.01 millisecond or more and 1 millisecond or less to perform the flash heating of the thin film of the high-k material. A flash heat treatment performed in the atmosphere of a nitrogen/helium mixed gas or nitrogen/argon mixed gas with a predetermined concentration gives crystallinity to the thin film of the high-k material on the surface of a semiconductor wafer W.

When the film thickness of the high-k material is relatively thick and is larger than a predetermined value, a flash heat treatment is performed in a mixed gas in which nitrogen is mixed with oxygen. Specifically, while the reactive gas feed section 84 opens the valve 86 and supplies oxygen gas as a reactive gas in the chamber 6, the inert gas feed section 81 opens the valve 83 and supplies nitrogen gas as an inert gas in the chamber 6. With both the valve 83 and the valve 86 opened, a mixed gas in which nitrogen as the inert gas is mixed with oxygen as the reactive gas is supplied to the heat treating space 65 in the chamber 6. Ozone may be supplied as a reactive gas instead of oxygen, and helium or argon may be supplied as an inert gas instead of nitrogen.

The oxygen concentration in the mixed gas in the heat treating space 65 in the chamber 6 is measured by the concentration sensor 180 and is transmitted to the control unit 3. The control unit 3 adjusts the concentration of the reactive gas so that the oxygen concentration in the mixed gas in the heat treating space 65 may coincide with a predetermined value set in advance, based on the result measured by the concentration sensor 180. Specifically, when the measured result of the oxygen concentration by the concentration sensor 180 is lower than the predetermined value, the control unit 3 controls the flow control valve 186 so as to increase the flow of oxygen. On the contrary, when the measured result of the oxygen concentration by the concentration sensor 180 is higher than the predetermined value, the control unit 3 controls the flow control valve 186 so as to decrease the flow of oxygen. In this manner, the control unit 3 controls the flow control valve 186 and adjusts the flow of oxygen as the reactive gas so that the measured result of the oxygen concentration by the concentration sensor 180 may approach the predetermined value. Similarly to the above, the oxygen concentration in the mixed gas in the heat treating space 65 may be adjusted by adjusting the flow of the inert gas. The oxygen concentration in the mixed gas may also be adjusted by adjusting the both flows of the reactive gas and the inert gas.

With the oxygen concentration, which is adjusted in this manner, in the mixed gas in the heat treating space 65 being coincident with the predetermined value set in advance, flash light is applied from the flash lamp FL to the surface of the semiconductor wafer W with the irradiation time of 0.01 millisecond or more and 1 millisecond or less to perform the flash heating of the thin film of the high-k material. A flash heat treatment performed in the atmosphere of a oxygen/nitrogen mixed gas with a predetermined concentration gives crystallinity to the thin film of the high-k material on the surface of the semiconductor wafer W and also oxidizes the high-k material. Furthermore, the flash heat treatment of the high-k material performed in an atmosphere in which the nitrogen concentration and the oxygen concentration is controlled at a predetermined value can give a desired electrical property to the high-k material.

In addition, similarly to the first preferred embodiment, since the flash light irradiation time is made to be 0.01 millisecond or more and 1 millisecond or less, which is remarkably shorter than conventional one, the excessive heating of the thin film of the high-k material is suppressed. As a result, the excessive temperature rise of the thin film of the high-k material is suppressed, and the thin film can be prevented from exfoliating from the base material. In particular, since the film thickness of the high-k material formed by the atomic layer deposition method is extremely thin, as comparable to one atomic layer, it is preferable that the flash light irradiation time be made to be 0.01 millisecond or more and 1 millisecond or less, which is quite a short time.

Modification

As mentioned above, although the preferred embodiments of the present invention were described, the present invention can make various modifications in addition to what were mentioned above unless the present invention deviates from its spirit. For example, although the amorphous silicon thin film 103 is formed on the silicon dioxide base material 102 in the first preferred embodiment mentioned above, instead of amorphous silicon, a poly-silicon thin film may be formed on the silicon dioxide base material 102. By irradiating the poly-silicon thin film formed on the silicon dioxide base material 102 with flash light from the flash lamp FL with the irradiation time of 0.01 millisecond or more and 1 millisecond or less, similarly to the first preferred embodiment, crystallization can be promoted while the excessive heating of the thin film is suppressed.

In each of the preferred embodiments mentioned above, the IGBT 96 makes the energization period to the flash lamp FL to be 0.01 millisecond or more and 1 millisecond or less, but a method is not limited to this. The flash light irradiation time of 0.01 millisecond or more and 1 millisecond or less may be specified by using another method. For example, the energization period to the flash lamp FL may be made to be 0.01 millisecond or more and 1 millisecond or less, by adjusting the inductance of the coil 94 and the electrostatic capacitance of the capacitor 93, and without providing the IGBT 96 in the circuit.

Although the IGBT 96 is used as a switching element in each of the preferred embodiments mentioned above, instead of this, another transistor may be used that can turn the circuit on and off according to a signal level inputted into the gate. However, since considerably large electric power is consumed by the emission of the flash lamp FL, it is preferable to employ a GTO (Gate Turn Off) thyristor or an IGBT, which is suitable for handling of large electric power, as a switching element.

The amorphous silicon thin film 103 is formed on the silicon dioxide base material 102 in the first preferred embodiment and the thin film of a hafnium compound is formed on the base material of silicon in the second preferred embodiment, but an object to be treated by the heat treatment technique according to the present invention is not limited to these materials. For example, flash light may be applied to a thin film of photo-resist formed on the silicon base material with an irradiation time of 0.01 millisecond or more and 1 millisecond or less. In particular, when an extremely thin film of photo-resist is formed, the irradiation time of flash light is preferably made to be 0.01 millisecond to 0.1 millisecond. Furthermore, an amorphous silicon or poly-silicon thin film on a glass substrate, which is made from silicon dioxide and is used for a liquid crystal display and the like, and flash light may be applied to the thin film with an irradiation time of 0.01 millisecond or more and 1 millisecond or less. That is, the heat treatment technique according to the present invention is applicable when a heat treatment is performed for a thin film that is formed on a base material with different material from that of the base material.

In the preferred embodiments mentioned above, although the heater 71 that is heating means is configured by a resistance heating element, instead of this, the temperature control of the semiconductor wafer W may be performed by light irradiation heating using a halogen lamp, induction heating, spraying of high temperature gas, and the like.

Furthermore, instead of using the flow control valves 183, 186 and 189, another mechanism such as a massflow controller, which can control gas flow, may be used.

In the preferred embodiments mentioned above, although the flash irradiating part 5 is provided with thirty flash lamps FL, the number is not limited to this and arbitrary number of the flash lamps FL can be selected. The flash lamp FL is not limited to a xenon flash lamp, and may be a krypton flash lamp.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for performing a heat treatment of a thin film formed on a base material, the thin film being made of material different from the base material,
the heat treatment method comprising the steps of:
   (a) accommodating the base material, on which the thin film is formed, in a chamber and holding the base material; and
   (b) heating said thin film by irradiating said thin film with flash light with an irradiation time of 0.01 millisecond or more and of 1 millisecond or less,
further comprising the steps of:
   (c) performing exhaust from said chamber; and
   (d) supplying a treating gas into said chamber, wherein
   a mixed gas in which a reactive gas reacting with said thin film and an inert gas are mixed is supplied into said chamber in said step (d), and wherein
further comprising the steps of:
   (e) measuring a concentration of the reactive gas in the mixed gas in said chamber; and
   (f) adjusting the concentration of the reactive gas in the mixed gas by adjusting at least either of flows of the reactive gas and the inert gas based on a measured result in said step (e), wherein
   a thin film of a high-dielectric-constant film formed on a base material of silicon by an atomic layer deposition method is heated such that crystallinity is given to the thin film in said step (b), wherein
   a mixed gas in which helium or argon is mixed with nitrogen is supplied into said chamber when a film thickness of said high-dielectric-constant film is smaller than a predetermined value, and wherein
   a mixed gas in which nitrogen is mixed with oxygen is supplied into said chamber when the film thickness of said high-dielectric-constant film is larger than the predetermined value.

* * * * *